(12) United States Patent
Kitsomboonloha et al.

(10) Patent No.: US 10,769,982 B2
(45) Date of Patent: Sep. 8, 2020

(54) ALTERNATE-LOGIC HEAD-TO-HEAD GATE DRIVER ON ARRAY

(71) Applicant: Apple Inc., Cupertino, CA (US)

(72) Inventors: Rungrot Kitsomboonloha, San Jose, CA (US); Szu-Hsien Lee, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/234,127

(22) Filed: Dec. 27, 2018

(65) Prior Publication Data

US 2020/0074912 A1 Mar. 5, 2020

Related U.S. Application Data

(60) Provisional application No. 62/725,862, filed on Aug. 31, 2018.

(51) Int. Cl.
*G09G 3/20* (2006.01)
*G09G 3/3266* (2016.01)
*G09G 3/36* (2006.01)

(52) U.S. Cl.
CPC ......... *G09G 3/2092* (2013.01); *G09G 3/3266* (2013.01); *G09G 3/3677* (2013.01); *G09G 2310/0286* (2013.01); *G09G 2310/08* (2013.01)

(58) Field of Classification Search
CPC ... G09G 2310/0286; G09G 2300/0408; G09G 2310/0281; G09G 2310/067; G09G 3/3677; G09G 5/18; G09G 2310/0291; G09G 3/3688; G09G 2310/0205; G09G 2320/0209; G09G 2310/021; G09G 2300/0413; G09G 2300/0426; G09G 3/3266; G09G 2330/08; G09G 2320/0223; G09G 2310/0283; G11C 19/28; G02F 1/13454
See application file for complete search history.

(56) References Cited

U.S. PATENT DOCUMENTS

| | | | |
|---|---|---|---|
| 9,530,520 B2 | 12/2016 | Xu | |
| 9,786,242 B2 | 10/2017 | Dai | |
| 9,817,276 B2 | 11/2017 | Sakamoto et al. | |
| 9,842,542 B2 | 12/2017 | Duan et al. | |
| 2003/0231735 A1* | 12/2003 | Moon ................. | G09G 3/3685 377/64 |
| 2010/0315403 A1* | 12/2010 | Kaneyoshi .......... | G09G 3/3614 345/211 |
| 2015/0213746 A1* | 7/2015 | Kim .................... | G09G 3/3677 345/215 |
| 2018/0211717 A1 | 7/2018 | Feng et al. | |
| 2019/0005885 A1* | 1/2019 | Kim ..................... | H01L 27/124 |
| 2019/0013083 A1* | 1/2019 | Wang .................. | G09G 3/3677 |
| 2019/0066560 A1* | 2/2019 | Mi ....................... | G11C 19/28 |

* cited by examiner

*Primary Examiner* — Sanjiv D. Patel
(74) *Attorney, Agent, or Firm* — Fletcher Yoder, P.C.

(57) ABSTRACT

The disclosure is related to head-to-head (H2H) gate on arrays (GOA) for pixel-based displays that may have reduced dimensions. In the described embodiments, the H2H design with alternate logic may be used to drive groups of pixels (e.g., a pixel row or column) with a primary and a secondary driver, located in opposite ends of the bezel of the electronic device. In the alternate-logic design, a shared shift-register may be used to enable two rows or columns. Embodiments in which more than two rows or columns are controlled by a single shift register are also described.

21 Claims, 12 Drawing Sheets

ALTERNATE-LOGIC HEAD-TO-HEAD GATE DRIVER ON ARRAY

CROSS-REFERENCE TO RELATED APPLICATIONS

This application claims priority from and the benefit of U.S. Provisional Application Ser. No. 62/725,862, entitled "ALTERNATE-LOGIC HEAD-TO-HEAD GATE DRIVER ON ARRAY", filed Aug. 31, 2018, which is hereby incorporated by reference in its entirety for all purposes.

BACKGROUND

The present disclosure relates generally to display devices and, more specifically, to gate drivers on array circuitry of the display devices.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

In many devices, such as televisions, smartphones, computer panels, smartwatches, among others, display panels are employed to provide a user interface for displaying information and facilitate interaction. For example, in organic light emitting diode (OLED) panels, pixels may be arranged in rows and columns, and may receive driving voltages and/or data signals to produce images. In many systems, power to pixels may be provided in a row-by-row basis or column-by-column basis.

The driving circuitry that powers the pixels may be disposed in the border region (e.g., a bezel) of the device and operate by gating each row sequentially. In compact devices, a decrease in the dimensions of the bezel may be limited by, among other things, the size of the driving circuitry.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In certain pixel-based panels of electronic devices, pixels may receive power through gated power lines. To activate groups in an ordered manner (e.g., row-by-row, column-by-column), gate driver on array (GOA) circuitry may be used as part of the circuitry that controls the provision of power to the power lines driving the pixels. GOA may be used to gate the activation of groups of pixels in a display based on a synchronizing clock signal. Embodiments described herein are related to head-to-head (H2H) GOA designs that may employ an alternate-logic structure. In the H2H design, the group of pixels may be driven from both ends of the bezel to provide redundancy and better driving performance In the alternate-logic structure, a shared shift-register may be used to enable two rows, which may decrease the footprint of the GOA circuitry. As a result, embodiments of electronic devices having bezels (e.g., display borders) with reduced dimension are also described.

With the foregoing in mind, an electronic device is described. The electronic device may include a display that has an array of pixels arranged in groups and a gate on array circuitry. The gate on array circuitry may have a first driver that receives a first clock signal and a first gate-enable signal, also referred to herein as Q node, and may provide a driving output signal to a pixel group. The gate on array circuitry may have a second driver that receives a second clock signal and the same first gate-enable signal, and may provide a second driving output signal to a second pixel group. The gate on array circuitry may also have a single shift register that generates the common first gate-enable signal.

In another embodiment, a display is described. The display may have a display portion having multiple of rows and a bezel that includes first and second bezel portions that are located on opposite sides of the bezel. A first gate on array circuitry may be disposed in the first bezel portion and may have a first group of logic units. At least one logic unit may drive two rows. A second gate on array circuitry may be disposed in the second bezel portion and may have a second group of logic units. At least one logic unit of the second group of logic units may drive two rows and at least one of these two rows is common with the two rows driven by the at least one logic unit of the first group of logic units.

In another embodiment, a method for displaying image data in a display panel is disclosed. The display panel may have multiple pixel groups. The method may include enabling two driver circuits on a first side of the display panel using a first gate-enable signal. The method may also include enabling two driver circuits on an opposite side of the display panel using a second gate-enable signal. The method may also include a process for providing a driving output signal to a common pixel group from one of the two driver circuits of the first side of the display panel and one of the two driver circuits of the opposite side of the display panel.

In another embodiment, a display is described. The display may include a pixel array formed from a group of pixel rows. The display may also include a bezel located along the periphery of the pixel array and may have a bezel portion having a bezel width. The bezel portion may contain a gate on array circuitry formed from logic units. Each logic unit may have a shift register coupled, each, to a respective primary and a respective secondary driver. The bezel length may have a portion that associated with (e.g., limited by, related to) dimensions of the gate on array circuitry and, thus, a reduction in the dimensions of the gate on array circuitry may lead to reduction in the bezel length.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
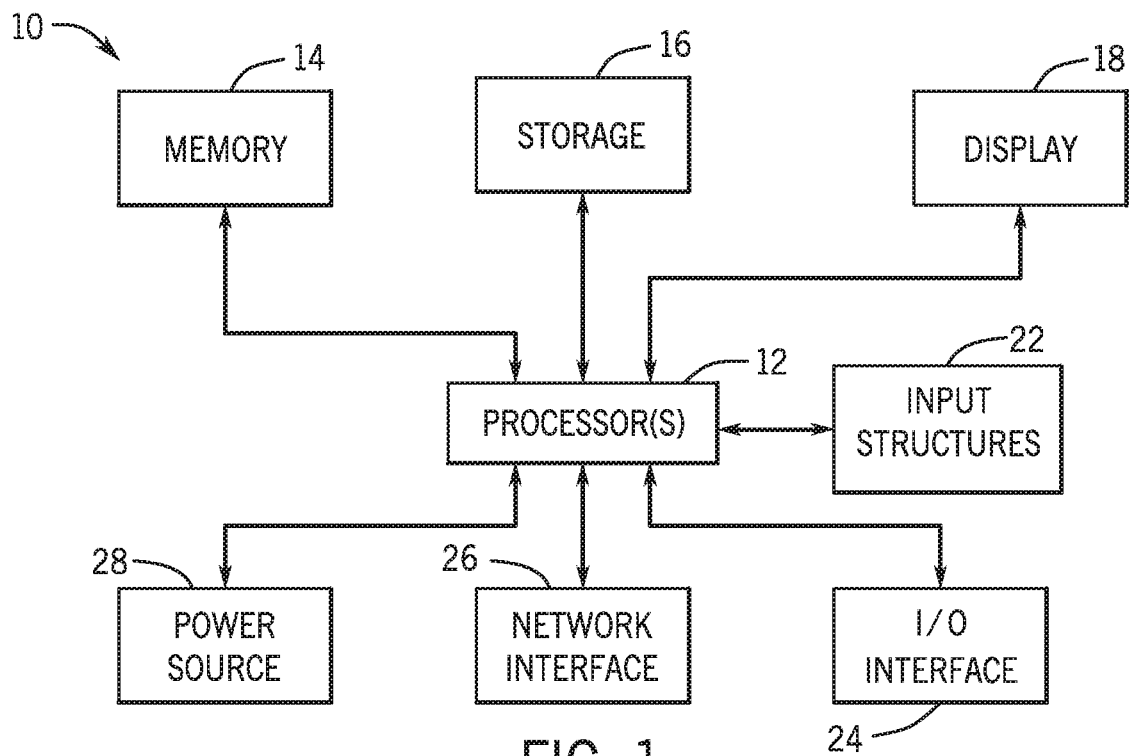
FIG. 1 is a schematic block diagram of an electronic device that may benefit from the head-to-head (H2H) gate on array (GOA) circuitry for display driving, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electronic devices may use display panels to provide user interfaces. User display panels may be pixel-based panels, such as liquid crystal displays (LCD) panels, light-emitting diode (LED) panels, organic light emitting diodes (OLED) panels and/or plasma panels. In these panels, pixels are typically be arranged in rows and columns, which may receive power through gated power lines. The power, provided as driving signals, may operate in coordination with data signals to facilitate the formation of images. For example, a display may have multiple rows that are sequentially activated (e.g., one row at a time) with driving signals which are sequentially provided at each display cycle. To that end, gate on array (GOA) circuitry may receive a power signal (e.g., a driving signal) and gate the signal to each power line individually. Synchronizing clock signals may be used to gate each of the rows.

Circuitry that generates driving signals, such as the GOA, may be dedicated circuitry that is located along the borders of the display within the device. In some systems, including head-to-head (H2H) GOA systems, GOA circuitry may be located in opposite sides of the bezel of the display, as further detailed below. The use of H2H architectures in GOA circuitry may provide redundancy in the driving of pixel rows, which may increase the manufacturing yield and the reliability of the electronic device. H2H architectures may also decrease interlaced artifacts by reducing differences in adjacent lines due to kickback voltages that may appear in conventional interlaced architecture. As such, H2H architectures may provide an improved performance for displays. However, conventional H2H architectures may employ larger circuitry than conventional interlaced circuitry due to the presence of circuitry on both ends.

Due to its disposition within, or next to, the bezel of the electronic device, a decrease in the dimensions of the bezel may be limited, at least in part, by the size of the GOA circuitry. Thus, reduction of the dimensions in the GOA logic may allow a decrease in border dimensions, which may lead to reduced size bezels. Embodiments described herein relate to display drivers and/or GOA circuitry that may have a reduced size by employing alternate-logic head-to-head architecture. In the embodiments described herein, the GOA logic units employed in the alternate-logic head-to-head architecture may include a gating component (e.g., a shift register) that may control two or more rows of pixels. Therefore, a portion of the GOA logic unit for two rows is shared, thus reducing the amount of logic required to drive the display. The GOA logic described herein may be arranged in a H2H architecture, providing a reduced bezel with the alternate logic circuitry with redundancy and the reduction and/or elimination of interlaced artifacts.

With the foregoing in mind, a general description of suitable electronic devices with reduced bezel dimensions that may employ alternate-logic GOA systems for display driving, as discussed herein, are provided below. Turning first to FIG. 1, an electronic device 10 according to an embodiment of the present disclosure may include, among other things, one or more processor(s) 12, memory 14, nonvolatile storage 16, a display 18, input structures 22, an input/output (I/O) interface 24, a network interface 26, and a power source 28. The various functional blocks shown in FIG. 1 may include hardware elements (including circuitry), software elements (including computer code stored on a computer-readable medium) or a combination of both hardware and software elements. It should be noted that FIG. 1 is merely one example of an implementation and is intended to illustrate the types of components that may be present in electronic device 10.

Figure 2:
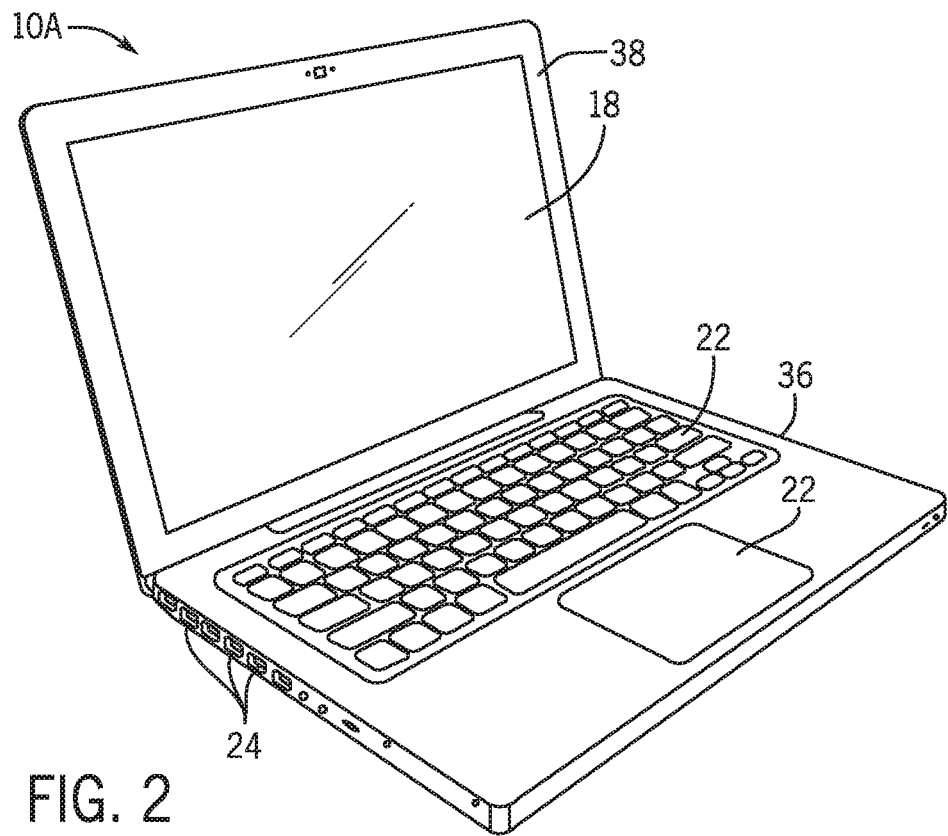
FIG. 2 is a perspective view of a notebook computer representing an embodiment of the electronic device of FIG. 1, in accordance with an embodiment.
Figure 4:
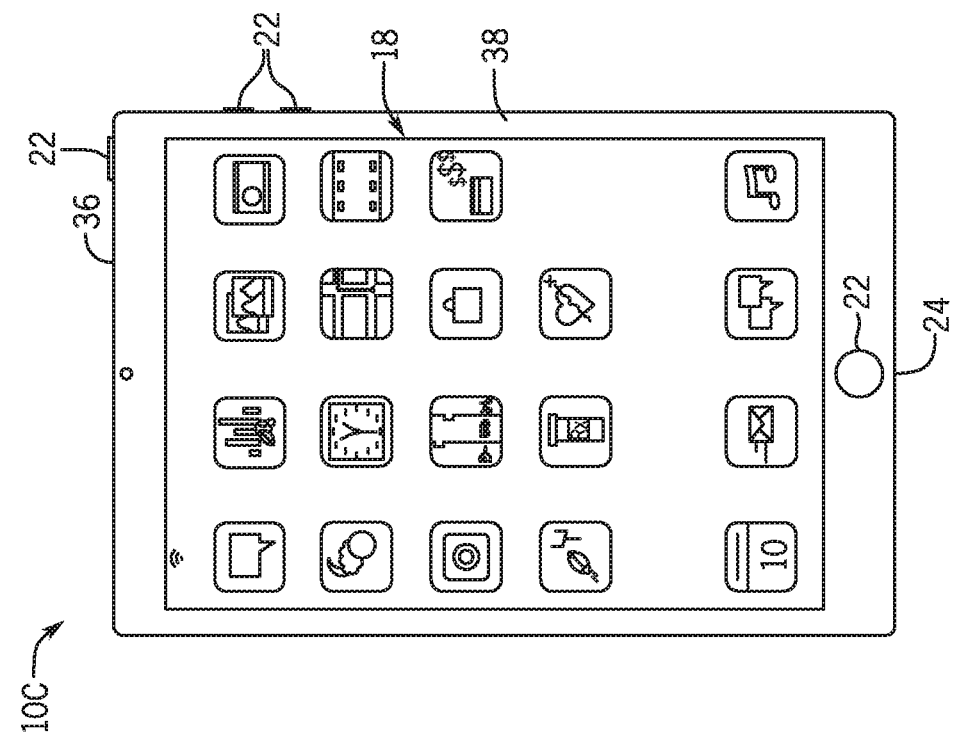
FIG. 4 is a front view of another hand-held device representing another embodiment of the electronic device of FIG. 1, in accordance with an embodiment.
Figure 3:
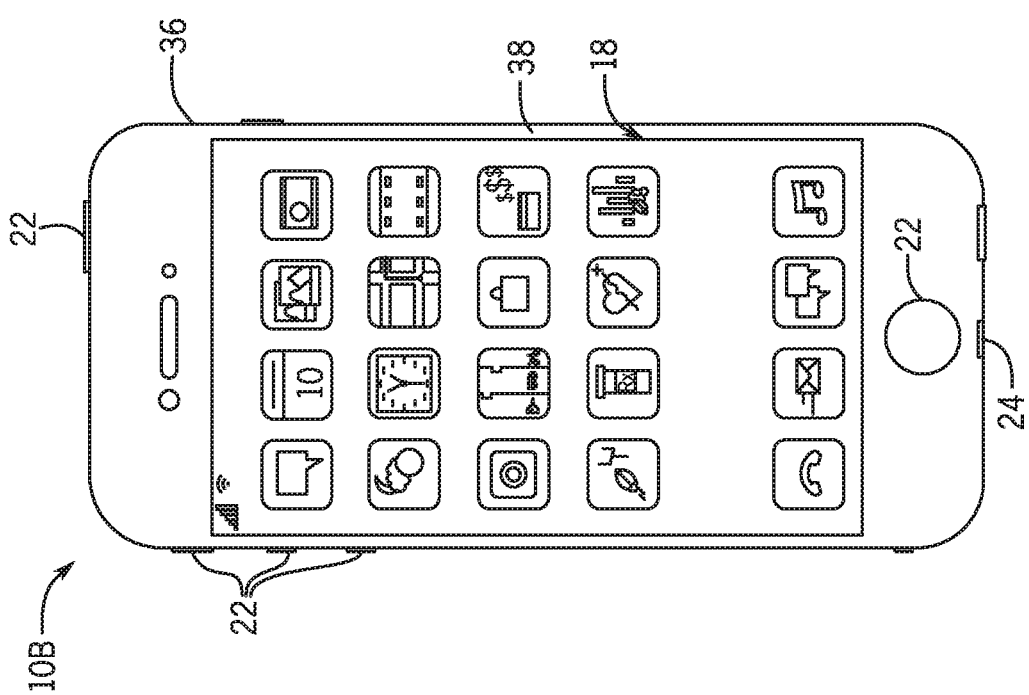
FIG. 3 is a front view of a hand-held device representing another embodiment of the electronic device of FIG. 1, in accordance with an embodiment.
Figure 5:
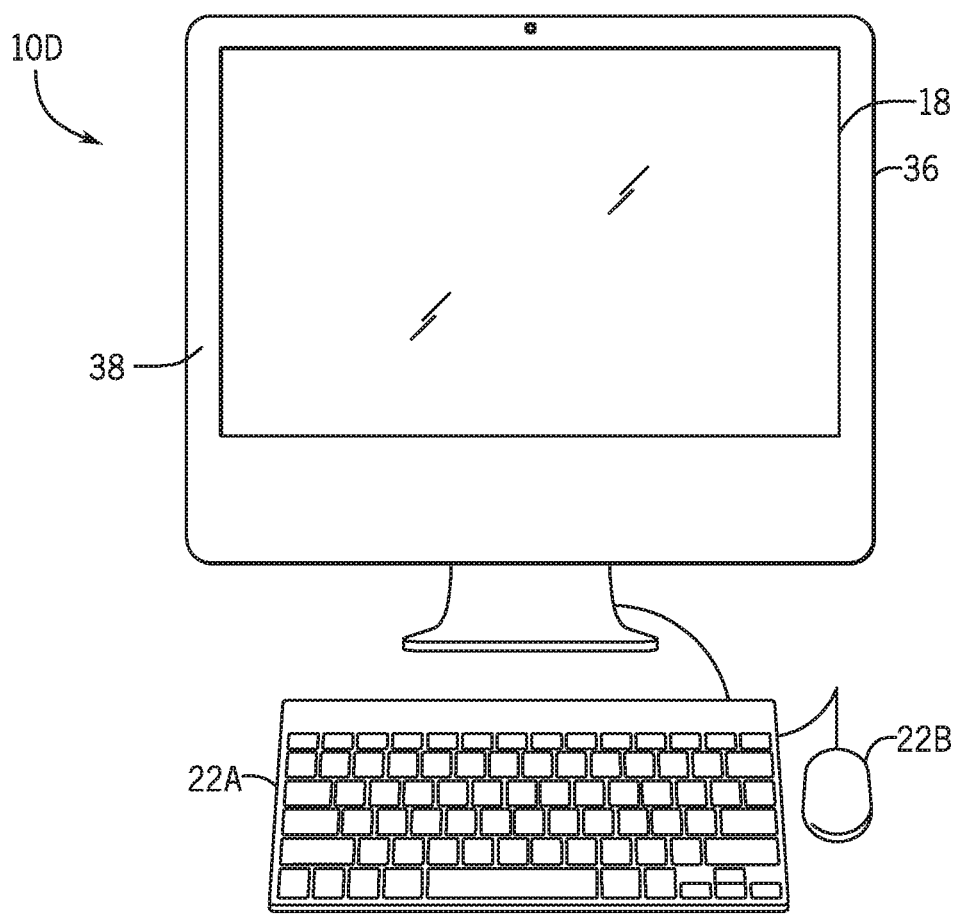
FIG. 5 is a front view of a desktop computer representing another embodiment of the electronic device of FIG. 1, in accordance with an embodiment.
Figure 6:
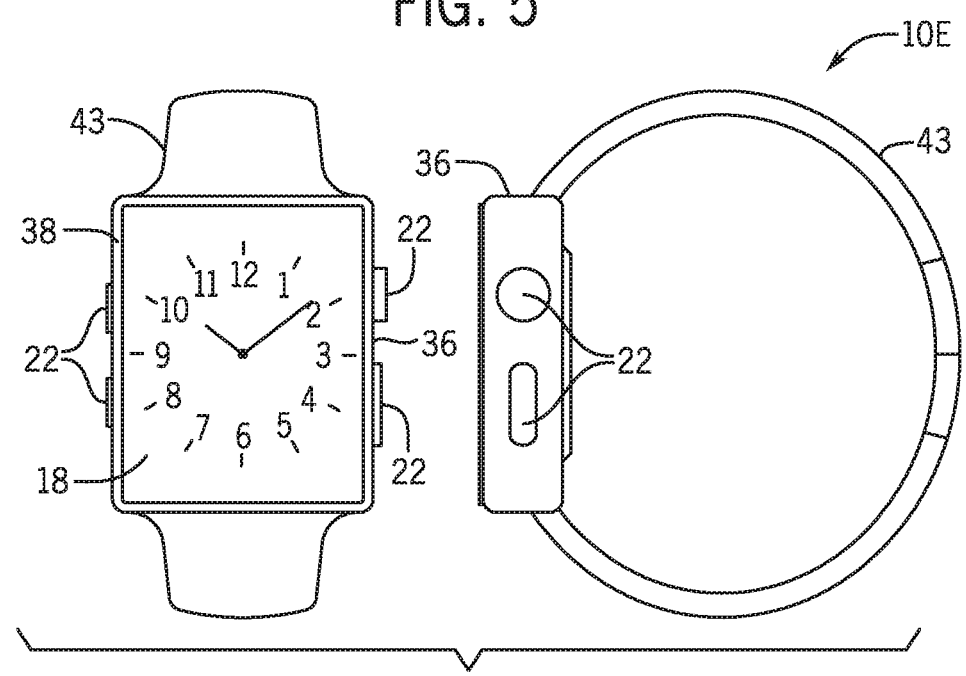
FIG. 6 is a front view and side view of a wearable electronic device representing another embodiment of the electronic device of FIG. 1, in accordance with an embodiment.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 may be operably coupled with the memory 14 and the nonvolatile storage 16 to perform various algorithms Such programs or instructions executed by the processor(s) 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor(s) 12 to enable the electronic device 10 to provide various functionalities.

In certain embodiments, the display 18 may be a liquid-crystal display (LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more organic light emitting diode (OLED) displays, or some combination of LCD panels and OLED panels. The display 18 may receive images, data, or instructions from processor(s) 12 or memory 14, and provide an image in display 18 for interaction. The display panels in display 18 may be disposed within a border and/or a bezel 38, which may include a portion of the driving circuitry, including the alternate logic GOA circuitry described herein.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. The network interface 26 may include, for example, one or more interfaces for a personal area network (PAN), such as a Bluetooth network, for a local area network (LAN) or wireless local area network (WLAN), such as an 802.11x Wi-Fi network, and/or for a wide area network (WAN), such as a 3rd generation (3G) cellular network, 4th generation (4G) cellular network, long term evolution (LTE) cellular network, or long term evolution license assisted access (LTE-LAA) cellular network. The network interface 26 may also include one or more interfaces for, for example, broadband fixed wireless access networks (WiMAX), mobile broadband Wireless networks (mobile WiMAX), asynchronous digital subscriber lines (e.g., ADSL, VDSL), digital video broadcasting-terrestrial (DVB-T) and its extension DVB Handheld (DVB-H), ultra-Wideband (UWB), alternating current (AC) power lines, and so forth. As further illustrated, the electronic device 10 may include a power source 28. The power source 28 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations, and/or servers). In certain embodiments, the electronic device 10 in the form of a computer may be a model of a MacBook®, MacBook® Pro, MacBook Air®, iMac®, Mac® mini, or Mac Pro® available from Apple Inc.

By way of example, the electronic device 10, taking the form of a notebook computer 10A, is illustrated in FIG. 2 in accordance with one embodiment of the present disclosure. Notebook computer 10A, or laptop computer, may be a MacBook®, MacBook® Pro, MacBook Air® by Apple, Inc. The depicted computer 10A may include a housing or enclosure 36, a display 18 framed by a bezel 38 of the enclosure 36, input structures 22, and ports of an I/O interface 24. In one embodiment, the input structures 22 (such as a keyboard and/or touchpad) may be used to interact with the computer 10A, such as to start, control, or operate a GUI or applications running on computer 10A. For example, a keyboard and/or touchpad may allow a user to navigate a user interface or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPhone® available from Apple Inc. of Cupertino, Calif. The handheld device 10B may include an enclosure 36 to protect interior components from physical damage and to shield them from electromagnetic interference. The enclosure 36 may include bezel 38, which surrounds the display 18. The bezel 38 may also include portions of the GOA circuitry and/or other circuitry that drives rows and/or columns of pixels in display 18. The I/O interfaces 24 may open through the enclosure 36 and may include, for example, an I/O port for a hard-wired connection for charging and/or content manipulation using a standard connector and protocol, such as the Lightning connector provided by Apple Inc., a universal service bus (USB), or other similar connector and protocol.

User input structures 22, in combination with the display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control, or may toggle between vibrate and ring modes. The input structures 22 may also include a microphone may obtain a user's voice for various voice-related features, and a speaker may enable audio playback and/or certain phone capabilities. The input structures 22 may also include a headphone input may provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, Calif. The handheld device 10C may include an enclosure 36 to protect interior components from physical damage and to shield them from electromagnetic interference. The enclosure 36 may include bezel 38, which surrounds the display 18. The bezel 38 may also include portions of the GOA circuitry and/or other circuitry that drives rows and/or columns of pixels in display 18. The I/O interfaces 24 may open through the enclosure 36 and may include, for example, an I/O port for a hard-wired connection for charging and/or content manipulation using a standard connector and protocol, such as the Lightning connector provided by Apple Inc., a universal service bus (USB), or other similar connector and protocol.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, or other similar device by Apple Inc. It should be noted that the computer 10D may also represent a personal computer (PC) by another manufacturer. A similar enclosure 36 may be provided to protect and enclose internal components of the computer 10D such as the display 18. The display 18 may be surrounded by a bezel 38 of the enclosure 36. In certain embodiments, a user of the computer 10D may interact with the computer 10D using various peripheral input devices, such as the keyboard 22A or mouse 22B (e.g., input structures 22), which may connect to the computer 10D.

Similarly, FIG. 6 depicts a wearable electronic device 10E representing another embodiment of the electronic device 10 of FIG. 1 that may operate using the techniques described herein. By way of example, the wearable electronic device 10E, which may include a wristband 43, may be an Apple Watch® by Apple, Inc. However, in other embodiments, the wearable electronic device 10E may include any wearable electronic device such as, for example, a wearable exercise monitoring device (e.g., pedometer, accelerometer, heart rate monitor), or other device by another manufacturer. The display 18, framed by a bezel 38 of the enclosure 36 of the wearable electronic device 10E may include a touch screen display 18 (e.g., LCD, OLED display, active-matrix organic light emitting diode (AMOLED) display, and so forth), as well as input structures 22, which may allow users to interact with a user interface of the wearable electronic device 10E.

Figure 7:
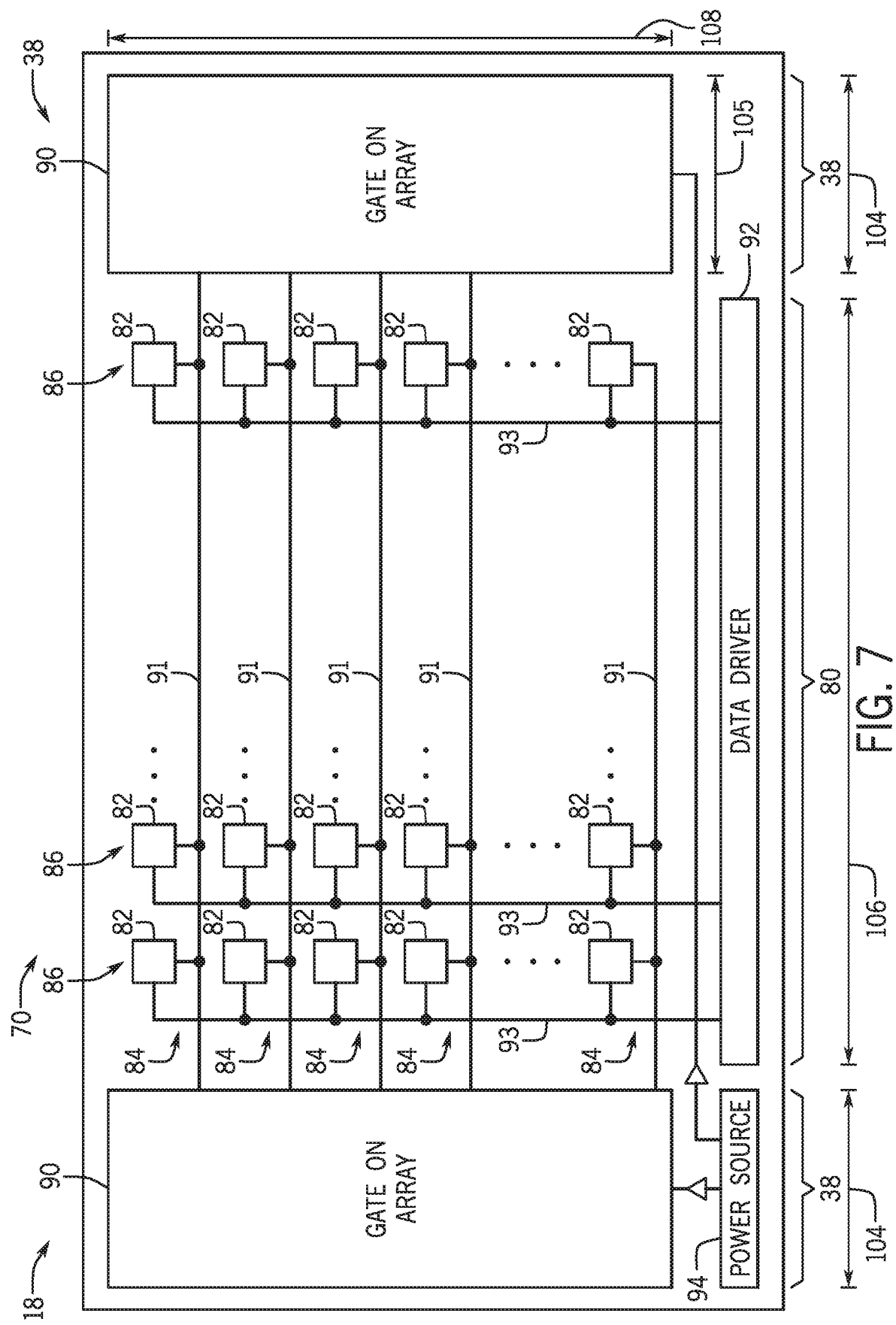
FIG. 7 is a schematic diagram of a display panel that includes an H2H GOA with alternate-logic and may be used with the electronic device of FIG. 1, in accordance with an embodiment.

FIG. 7 provides a schematic diagram for a pixel-based display 18. The display 18 may have a display panel 80 may be formed by an array of pixels 82. Pixels 82 may be arranged in pixel rows 84 and pixel columns 86. In the illustrated display panel 80, the pixel rows 84 may be driven by an H2H GOA system 70, which include two GOA modules 90. The GOA modules 90 may drive the pixel rows 84 through driving lines 91. The pixels 82 may also receive image data from a data driver 92 through data lines 93. Pixels 82 may update the amount of emissions and/or colors based on the information received through a data line 93 and clocked by a driving signal received through a driving line 91. The GOA modules 90 may generate driving signals to driving lines 91 based on a signal received from a power source 94.

In the schematic diagram, the bezel 38 may have a width 104, which may be, among other things, be at least as wide as a width 105 of the GOA module 90. The display panel 80 may have a width 106 and a height 108, which may be based on a resolution of the display panel 80. For example, resolutions may be 1024×760, 1080p, or 4K. As discussed herein, the reduction in the size of the bezels may relate to a reduction in the width 104 of the bezel in absolute terms, a reduction of the width 104 relative to the length 106 of the display panel 80, and/or a reduction of the width 104 based on the number of pixel rows 84. It should be noted that, while the descriptions herein discuss the GOA modules 90 as operating on pixel rows 84, it should be understood that the GOA modules 90 may drive pixel columns 86, or any other groupings for the array of pixels 82.

Figure 8:
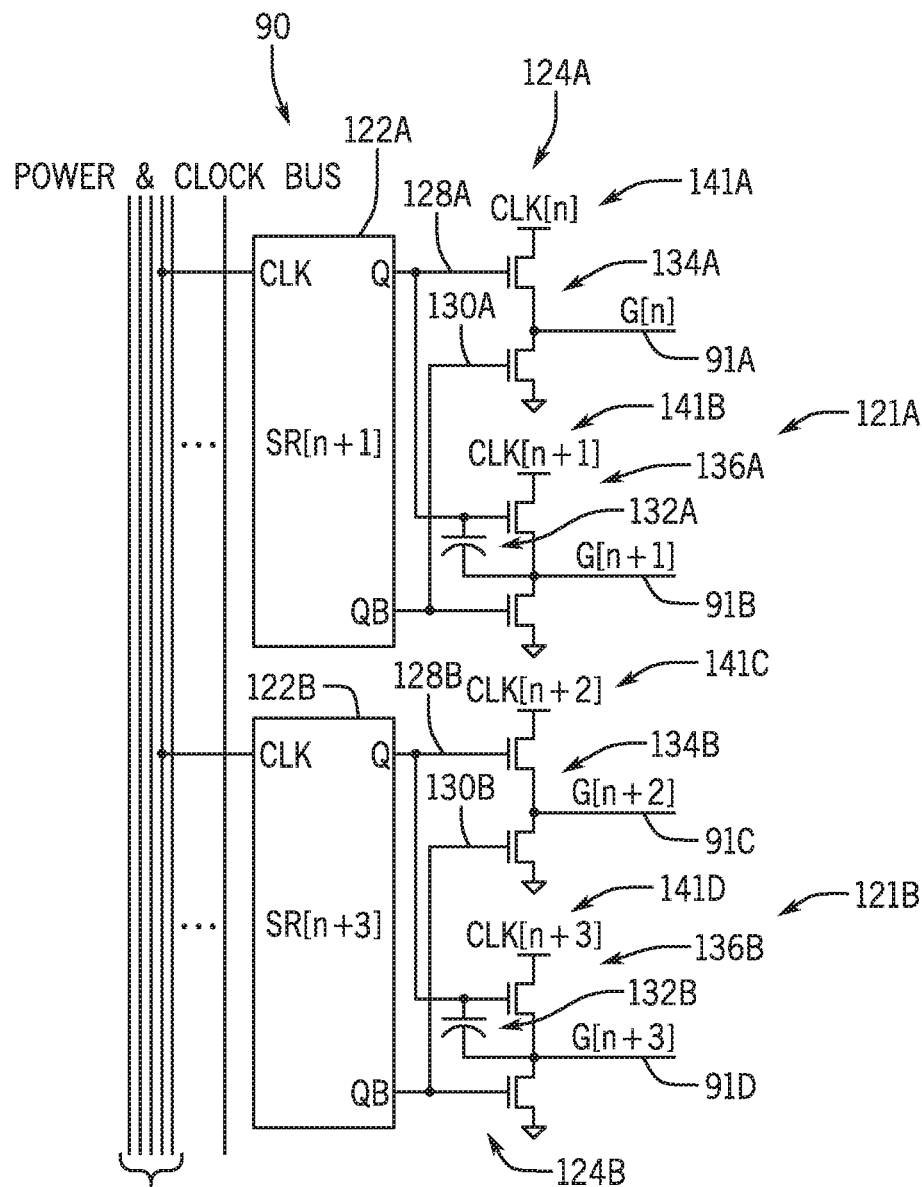
FIG. 8 is a schematic diagram of a GOA logic unit that may drive multiple pixel rows, in accordance with an embodiment.

FIG. 8 is a diagram that illustrates a portion of a GOA module 90 that implements an alternate-logic GOA system. The illustrated portion of the GOA module 90 includes gate logic units 121A and 121B. Gate logic unit 121A may include a shift register 122A and gate driver logic 124A. Similarly, gate logic unit 121B may include a shift register 122B and gate driver logic 124B. Shift registers 122A and 122B may receive power and clock signals from a power and clock bus 126. Based on a received clock signal, each shift register 122A, 122B, may produce an output gate-enable signal, which may include an output Q signal and a complementary output QB signal. In the illustrated system, shift registers 122A and 122B produce Q signals 128A and 128B, respectively, and complementary QB signals 130A and 130B, respectively.

The Q and QB signals may control a gate driver logic. For example, Q signal 128A and QB signal 130A may control each of the gate driver output circuits 134A and 136A of the gate driver logic 124A. In some embodiments, gate driver output circuits may include push-pull circuitry (e.g., a pull-up transistor and a pull-down transistor). Gate driver output circuits 134A and 134B may employ NMOS (i.e., n-type metal oxide semiconductor) transistors. A bootstrapping capacitor 132A may be used to assist the pull-up and -down operation of the NMOS transistors of both gate driver output circuits 134A and 134B. It should be understood that other types of transistors, such as p-type metal oxide semiconductor (PMOS) transistors, may be used to generate this circuitry and adaptations to the placement of bootstrapping capacitors 132A may be provided accordingly, in light of the teachings of provided herein.

The gate driver output circuit 134A, in operation, may be controlled by the output of the shift register 122A. When the Q signal 128A is high, and thus QB signal 130A is low, the output gate line 91A is pulled up and down to the value provided by the clock signal 141A. When the Q signal 128A is low, and thus QB signal 130A is high, the output gate line 91A may be pulled to gate low-level, which may be negative. The gate driver output circuit 136A may also be controlled by the same output of the shift register 122A. By contrast, however, the output gate line 91B is pulled up to the value provided by the clock signal 141B. In order to provide the sequential activation of rows, the clock signal 141A and 141B may include a phase shift between them, which is detailed below.

FIG. 8 also illustrates a second gate logic unit 121B, that includes the shift register 122B and the gate driver logic 124B. As with gate logic unit 121A, the gate logic unit 121B may drive two gate lines 91C and 91D using a single shift register 122B and two gate driver output circuits 134B and 136B. Gate driver output circuit 134B may pull the output gate line 91C up and down based on the clock signal 141C, and gate driver output circuit 136B may pull the output gate line 91D up and down based on the clock signal 141D. As discussed above, the two gate driver output circuits 134B and 136B may share a bootstrapping capacitor 132B.

As opposed to conventional GOA circuitry, in which each row may be coupled to a dedicated shift register, the shared shift register 122A, 122B in the GOA circuitry described above (i.e., a single shift register driving multiple pixel rows) may decrease the size of the GOA system as well as the number of components used to form the GOA logic. For example, in a system where a shift register is shared between two rows, the size of the GOA logic may be reduced by up to 50%. Further reduction in the number of shared bootstrapping capacitors 132A, 132B may further decrease the size and/or power consumption of the GOA logic. It should be noted that, while the above illustrations describe a single shift register being used to drive two pixel rows, modifications of the systems above that may be used to drive three, four, or more pixel rows are contemplated, with adjustments performed in view of the teachings provided herein.

Figure 9:
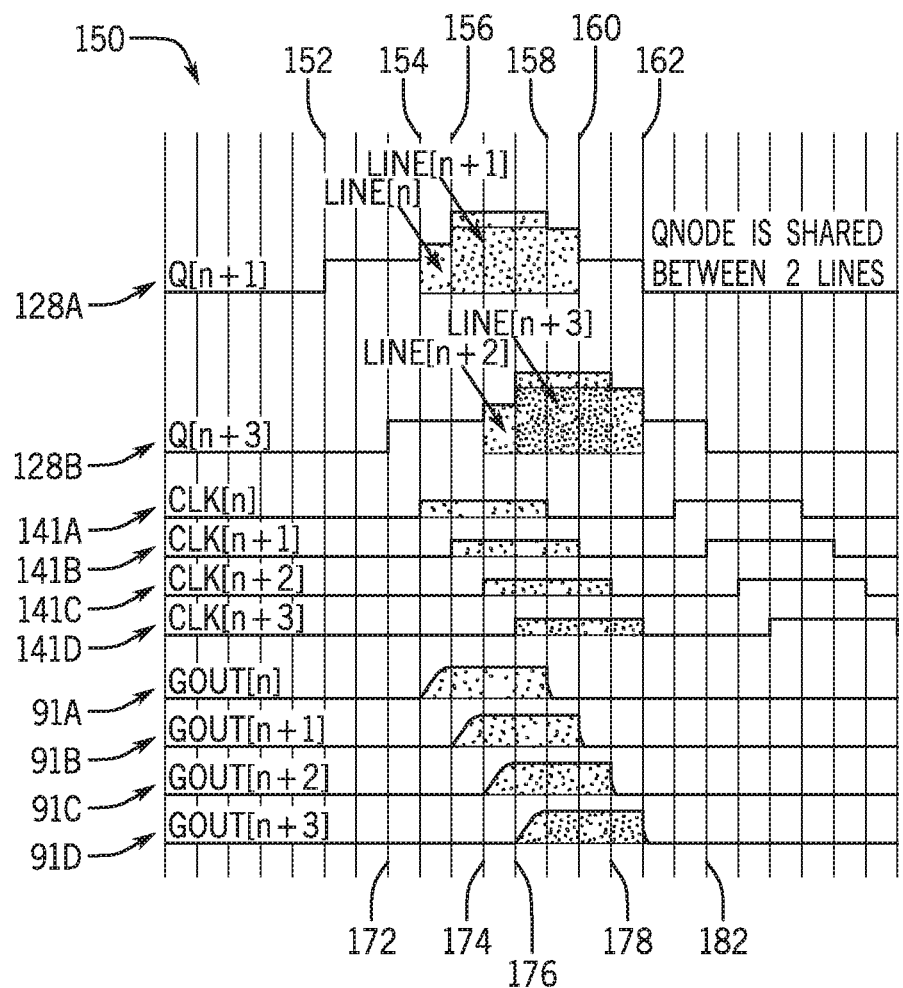
FIG. 9 is a chart illustrating simulated signals of a H2H GOA logic unit, such as that of FIG. 8, in accordance with an embodiment.

FIG. 9 provides a chart 150 illustrating signals that drive the gating logics 124A and 124B and the output signals that may drive output gate lines 91A, 91B, 91C, and 91D of FIG. 8. The signals in chart 150 may be related to one of the ends of the display (e.g., a left end). Specifically, chart 150 illustrates Q signals 128A and 128B, produced respectively by shift registers 122A and 122B, clock signals 141A, 141B, 141C, and 141D, and the output gate lines 91A, 91B, 91C, and 91D in a single display cycle (e.g., a refresh cycle, an update cycle). For example, Q signal 128A becomes enabled at time 152. At time 154, the clock signal 141A is enabled. As a result, the output gate line 91A is pulled high, and leads to activation of the pixels in the corresponding row. Note that the pull-up response may cause an increase in the Q signal 128A at time 154. At time 156, the clock signal 141B is enabled. As a result, the output gate line 91B is pulled high, and leads to activation of the pixels in the corresponding row. The Q signal 128A may increase further at time 156 due to the pull-up response on both gate driver output circuits 134A and 136A. Once the clock signals 141A and 141B are disabled, at times 158 and 160, respectively, the corresponding output gate lines 91A and 91B are disabled and pulled down to gate low-level. Furthermore, at time 162, the Q signal 128A may be disabled and the output gate lines 91A and 91B are maintained at low-level by the gate driver output circuits 134A and 136A and by the QB signal generated by gate driver logic.

The activation of output gate lines 91C and 91D during the display cycle is performed in a similar manner. The Q signal 128B may become enabled at time 172 and the gate driver output circuits 134B and 136B of gate driver logic 124B may be pull-up and -down output gate lines 91B and 91C to the voltage provided by clock signals 141C and 141D, respectively. Thus, when clock signal 141C becomes enabled, at time 174, the gate line 91C is pulled high, leading to activation of the pixels in the corresponding row. Similarly, when clock signal 141D becomes enabled, at time 176, the gate line 91D is pulled high, leading to activation of the pixels in the corresponding row. As with Q signal 128A, the Q signal 128B may be enhanced due to the operation of the gate driver output circuits 134B and 136B. Gate line 91C is pulled down once the clock signal 141C becomes disabled at time 178. Gate line 91D is pulled down once the clock signal 141D becomes disabled at time 162. Gate driver output circuits 134B and 136C may be secured by QB signal at low-level at time 182, when the Q signal 128B becomes disabled.

Figure 10:
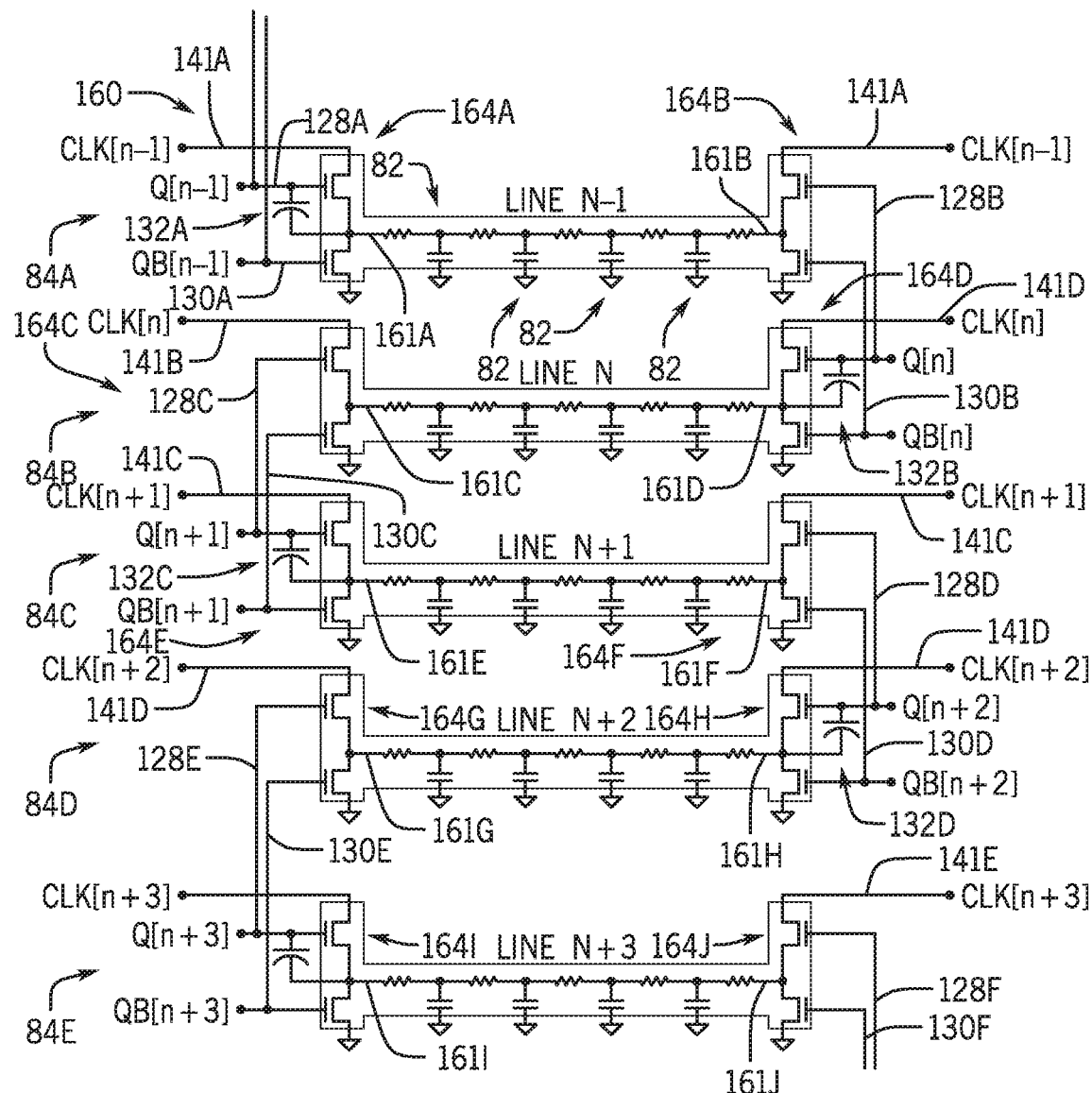
FIG. 10 is a schematic diagram of simplified pixel rows that may be driven by an alternate-logic H2H GOA system, in accordance with an embodiment.

The schematic diagram of FIG. 10 illustrates how the shared shift registers (e.g., shift registers that drive more than a single row) may be used in an alternate logic H2H GOA system 160 to drive pixel rows 84A, 84B, 84C, and 84D. In the diagram of the alternate-logic H2H GOA system 160, each pixel 82 is represented by a resistor-capacitor element along a gate line. Each pixel row is driven by gate line outputs. In particular, pixel row 84A is driven by outputs 161A and 161B, pixel row 84B is driven by outputs 161C and 161D, pixel row 84C is driven by outputs 161E and 161F, and pixel row 84D is driven by outputs 161G and 161H. Outputs 161A, 161B, 161C, 161D, 161E, 161F, 161G, and 161H are driven by the gate driver output circuits 164A, 164B, 164C, 164D, 164E, 164F, 164G, and 164H, respectively.

In the alternate logic H2H GOA system 160, each shift register (not illustrated in FIG. 10) may drive two gate driver output circuits, in an arrangement similar to the one illustrated in FIG. 10. Gate driver output circuit 164A may receive a Q signal 128A and a QB signal 130A from a first shift register in a left side of the circuit. Gate driver output circuits 164B and 164D may receive a common Q signal 128B and QB signal 130B from a second shift register in a right side of the circuit. Gate driver output circuits 164C and 164E may receive a common Q signal 128C and QB signal 130C from a third shift register in a left side of the circuit. Gate driver output circuits 164F and 164H may receive a common Q signal 128D and QB signal 130D from a fourth shift register in a right side of the circuit. Gate driver output circuit 164G and 164I may receive a Q signal 128E from a fifth shift register in a left side of the circuit. The relationship between the shift registers and the pixel rows in the alternate-logic system is further discussed below, with respect to FIG. 11.

It should be noted that the bootstrapping capacitors may be directly coupled to only one of the gate driver output circuits that drives a given pixel row. For example, pixel row 84A is driven by gate driver output circuits 164A and 164B. The bootstrapping capacitor 132A is directly coupled to the gate driver output circuit 164A, and the gate driver output circuit 164B does not have a bootstrapping capacitor directly coupled. The other pixels rows may be similarly arranged. In pixel row 84B, the bootstrapping capacitor 132B is directly coupled to the gate driver output circuit 164D, and the gate driver output circuit 164C does not have a bootstrapping capacitor directly coupled. In pixel row 84C, the bootstrapping capacitor 132C is directly coupled to the gate driver output circuit 164E, and the gate driver output circuit 164F does not have a bootstrapping capacitor directly coupled. In pixel row 84D, the bootstrapping capacitor 132D is directly coupled to the gate driver output circuit 164H, and the gate driver output circuit 164G does not have a bootstrapping capacitor directly coupled. This regular arrangement (e.g., one capacitor per pixel row) may allow a balanced distribution of driver strength along the gate lines, reducing the presence of interlacing artifacts. Moreover, as discussed with respect to FIG. 8, the shared bootstrapping capacitors may facilitate operation of the two gate driver output circuits coupled to them. As an example, the bootstrapping capacitor 132B, coupled to the common Q signal 128B, allows regular operation of the NMOS buffer transistors in both the gate driver output circuit 164B and gate driver output circuit 164D in contrast with conventional GOA circuitry in which each gate driver output circuit may use a dedicated bootstrapping capacitor. As a result, the number of capacitors in the GOA circuitry may be reduced relative to conventional systems, without affecting the choice of the transistor (i.e., using a PMOS pull-up transistor to obviate the bootstrapping capacitor) and/or switch technology used in the GOA circuitry.

Figure 11:
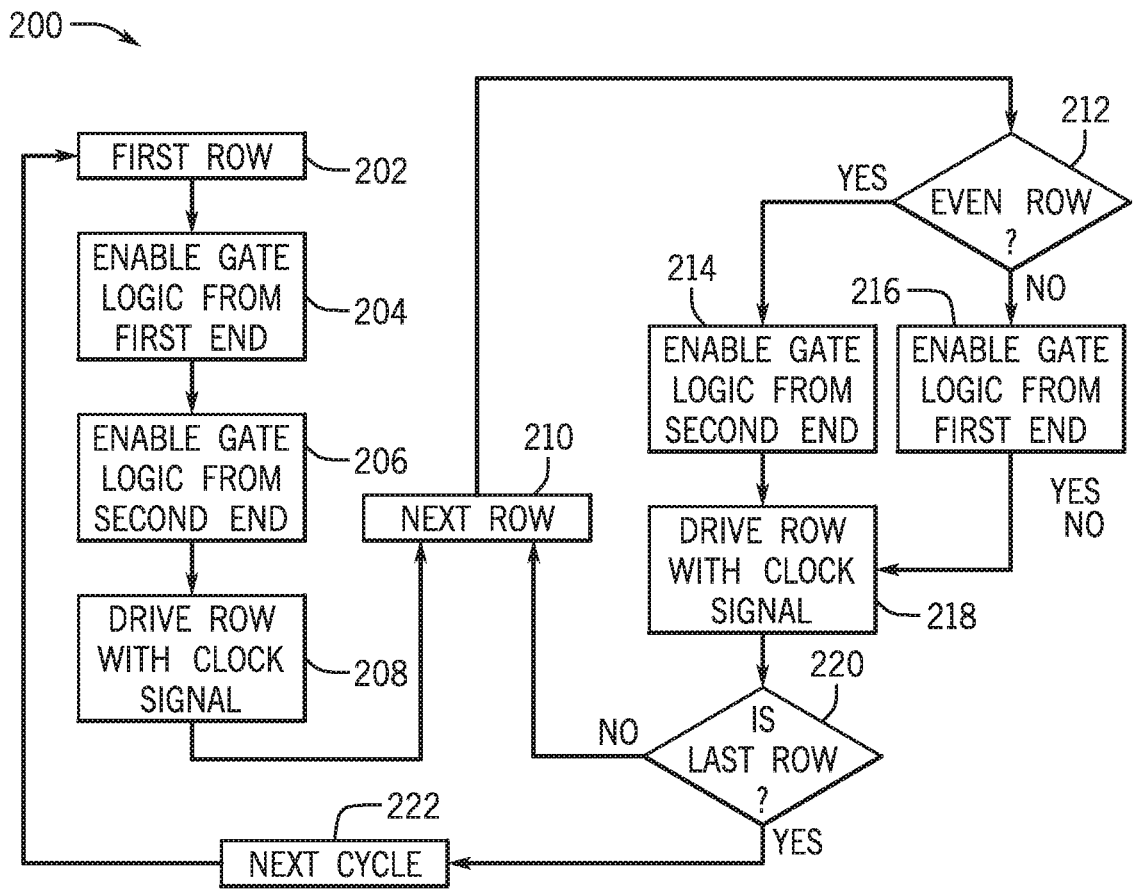
FIG. 11 is a method for operation of an alternate-logic H2H GOA system, in accordance with an embodiment.

FIG. 11 illustrates a method 200 for operating an alternate-logic H2H GOA system, such as the alternate-logic H2H GOA system 160, described above. The method 200 may be implemented by embodiments that include digital circuitry and/or switching circuitry that may be coupled to pixel rows, drive the pixel rows sequentially, and are arranged in an H2H manner, as discussed above. Implementations may include digital logic, analog circuitry, and/or hybrid circuitry, and may be implemented in integrated circuits and/or printed circuit boards.

As shown in process block 202, method 200 initialize the display of a first row. To that end, in process block 204, gate logic circuitry from a first end may provide a gate driver enable signal. In process block 204, gate logic circuitry from a second end may provide a second gate driver enable signal. In some embodiments, process blocks 202 and/or 204 may be associated with activation of dummy pixel rows. In a process block 208, a clock signal associated with the first row to the gate driver circuitry may provide a driving signal to the first row.

The display cycle may proceed to the next row in process block 210. Following the first row, the alternate-logic operation may be applied. A decision block 212 may be associated with the alternate-logic operation. That is, for even rows, gate enable signals may be initialized from the second end (process block 214) and for odd rows, gate enable signals may be initialized from the first end (process block 216). Note that, as illustrated, at least, in FIG. 9, each gate enable signal may be active for a period greater than that of the period of activation of two rows. As such, at the beginning of process block 218, the pixel row associated with the iteration may have an enabled gate driving circuit in both ends. In process block 218, a clock signal may be used to drive the pixels in the corresponding row. The process may proceed iteratively until the last row, as illustrated by decision block 220 and process block 210. At the end of displaying the last row, a next display cycle may begin, as represented by process block 222.

Figure 12:
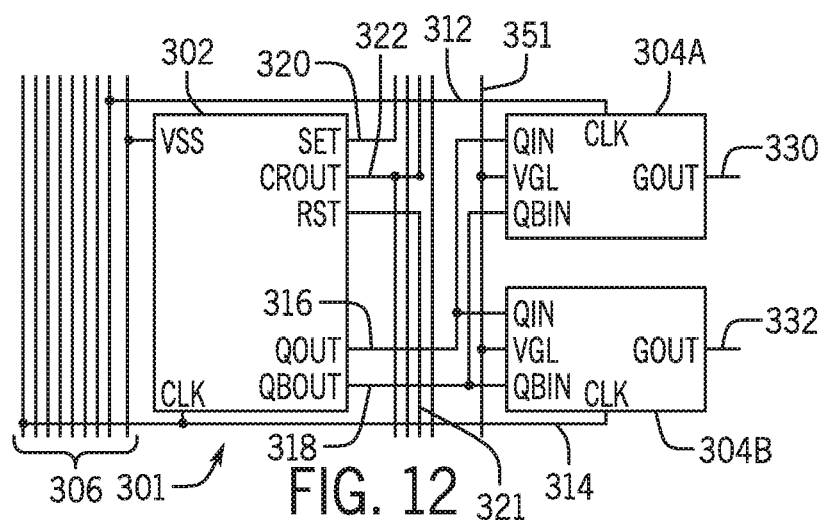
FIG. 12 is a circuit diagram of an embodiment of a GOA logic unit, in accordance with an embodiment.
Figure 13:
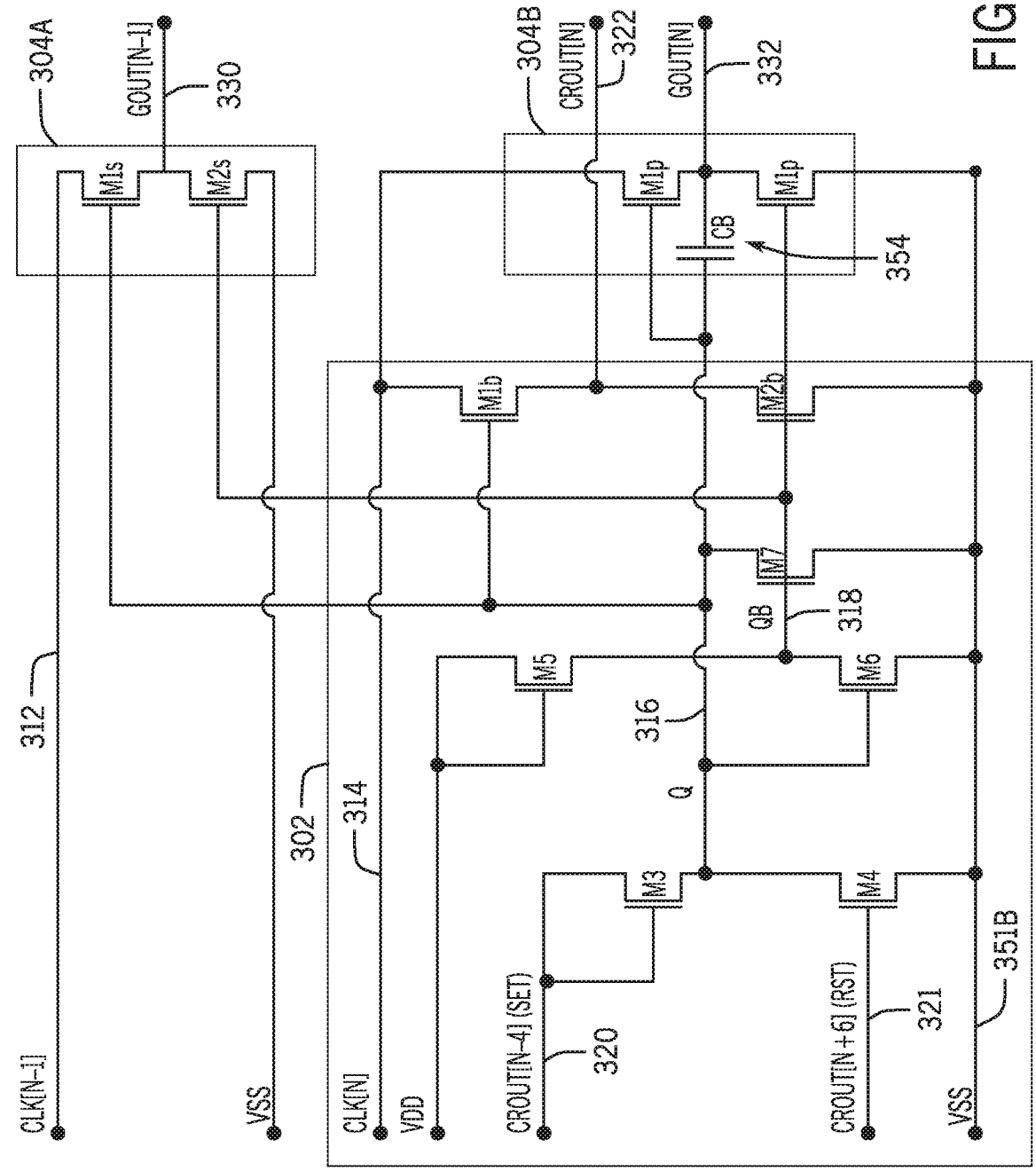
FIG. 13 is a circuit diagram of the GOA logic unit of FIG. 12, in accordance with an embodiment.

With the foregoing in mind, FIGS. 12, 13, 15, and 16 provide a detailed description and results for an embodiment of an alternate-logic H2H GOA system. FIG. 12 is a circuit diagram illustrating a GOA logic unit 301 that includes a shift register 302 and two output drivers, secondary driver 304A, and primary driver 304B. FIG. 13 is a circuit diagram illustrating an implementation of the GOA logic unit 301 of FIG. 12. The GOA logic unit 301 may receive power and/or clock signals 306, which may be used to drive the GOA logic unit 301.

As discussed above with respect to FIG. 8, the shift register 302 may output a Q signal 316 and a QB signal 318, based on a received primary clock signal 314, set signal 320, and reset signal 321. As illustrated in FIGS. 12 and 13, the shift register 302 may receive a set signal 320, a reset signal 321, and a primary clock signal 314. The set signal 320 and the reset signal 321 may be carry signals received from neighboring shift registers, as detailed with respect to FIG. 14. Upon receiving the set signal 320, the shift register 302 may provide a Q signal 316 and a QB signal 318 that may cause the secondary driver 304A and the primary driver 304B to pull the signals up to the voltage of the secondary clock signal 312 and the primary clock signal 314, respectively. It should be noted, as illustrated in FIG. 13, that the primary driver 304B has a bootstrapping capacitor 354 between the output 332 and the gate of the pull-up transistor. As such, every two drivers may share a shift register and a capacitor, in contrast with conventional systems in which each driver may employ a dedicated shift register and bootstrapping capacitor. This reduction in component may lead to a reduction in the GOA circuitry and allow smaller bezels around displays.

Figure 14:
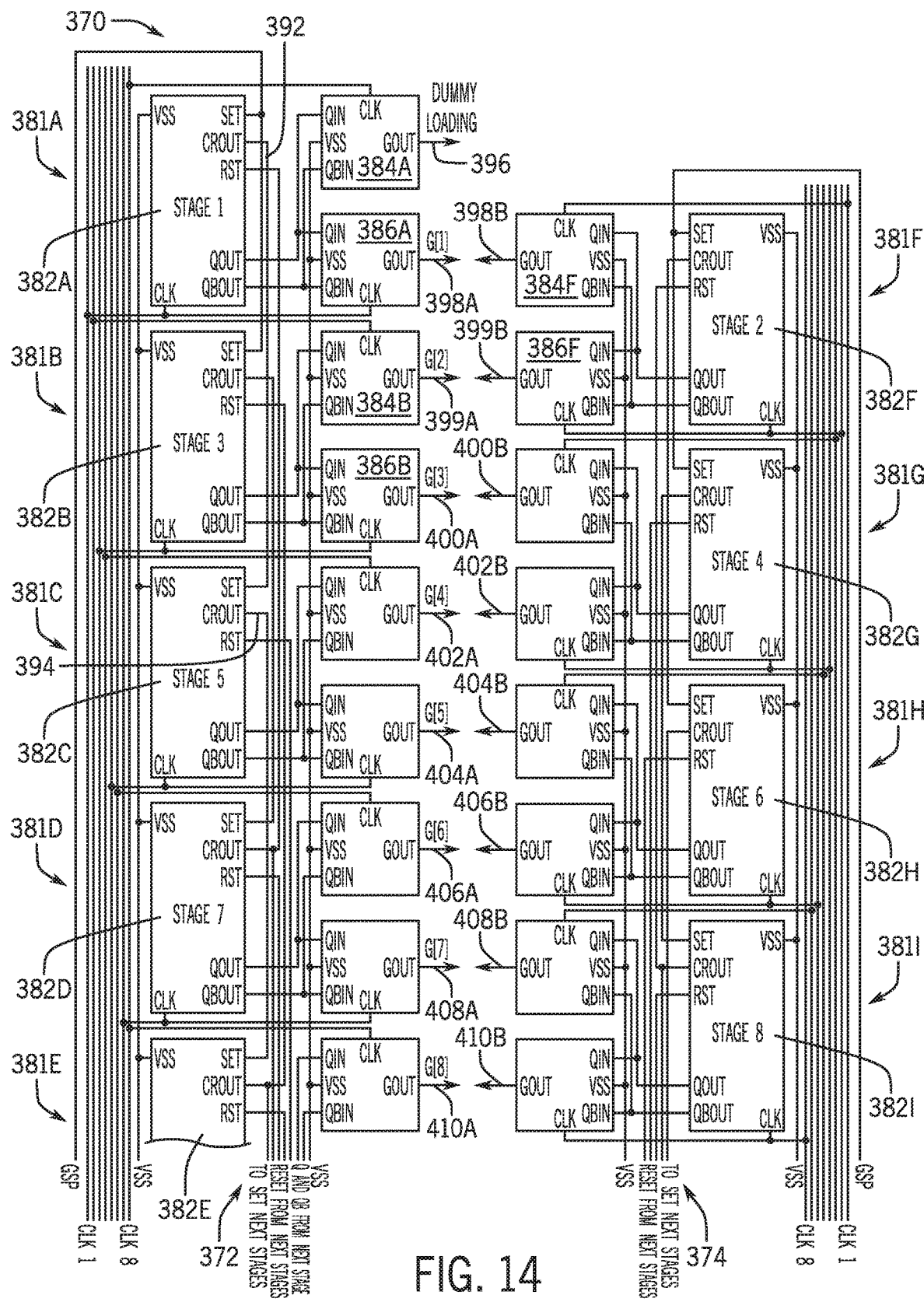
FIG. 14 is a circuit diagram of an alternate-logic H2H GOA system that may use GOA logic units such as that of FIG. 12, in accordance with an embodiment.

FIG. 14 illustrates a circuit diagram for a portion of an alternate-logic H2H GOA system 370 that may use GOA logic units, such as the GOA logic unit 301 illustrated in FIG. 12. The alternate-logic H2H GOA system 370 may also use the GOA logic unit illustrated in FIG. 18, or other GOA logic units capable of performing the method 200 discussed in FIG. 11. The alternate-logic H2H GOA system 370 may have a left side circuitry 372 and a right side circuitry 374, which may be disposed along or within a bezel of an electronic device, as discussed herein. In the illustrated portion, left side circuitry 372 may include logic units 381A, 381B, 381C, 381D, and 381E and right side circuitry 374 may include logic units 381F, 381G, 381H, and 381I. Each logic unit may be have a shift register. In particular, logic units 381A, 381B, 381C, 381D, 381E, 381F, 381G, 381H, and 381I include shift registers 382A, 382B, 382C, 382D, 382E, 382F, 382G, 382H, and 382I, respectively.

Each shift register may provide Q signals and QB signals to a primary driver and a secondary driver. For example, shift register 382A may provide signals to a secondary driver 384A and a primary driver 386A, shift register 382B may provide signals to a secondary driver 384B and a primary driver 386B, and shift register 382F may provide signals to a secondary driver 384F and a primary driver 386F. The primary drivers and the secondary drivers may drive pixel rows. The left side circuitry 372 and the right side circuitry 374 may drive pixel rows from each side of the alternate-logic H2H GOA system 370 in a redundant manner (e.g., in a manner similar to the one illustrated in FIG. 10). For example, signals 398A and 398B may drive a first pixel row, signals 399A and 399B may drive a second pixel row, signals 400A and 400B may drive a third pixel row, signals 402A and 402B may drive a fourth pixel row, signals 404A and 404B may drive a fifth pixel row, signals 406A and 406B may drive a sixth pixel row, signals 408A and 408B may drive a seventh pixel row, and signals 410A and 410B may drive an eight pixel row. The alternate-logic H2H GOA system 370 may generate more signals than described herein to drive more pixel rows in portions of the alternate-logic H2H GOA system 370 not illustrated in FIG. 14.

Each of the driving signals may be generated by a primary driver and a secondary driver. For example, a primary driver 386A and a secondary driver 384F generate, respectively, signals 389A and 398B that drive the first pixel row, as described above. In the second row, a secondary driver 384B and a primary driver 386F generate, respectively, signals 399A and 399B that drive the second pixel row. As discussed above, primary drivers (e.g., primary drivers 386A, 386B, 386F) may include a bootstrapping capacitor (e.g., bootstrapping capacitors 132A, 132B, 132C, 132D, 132D in FIG. 10) and, thus, may perform differently from the secondary driver (e.g., secondary drivers 384A, 384B, 384F) of a logic unit. Therefore, the logic units from the left side circuitry 372 may be staggered in relation to the logic units from the right side circuitry 374 to provide a balanced design, in which every pixel row is coupled to one primary driver and one secondary driver. Due to the staggered design, a secondary driver 384A may be coupled to a dummy load 396, as it does not couple to a pixel row. An alternative arrangement, in which the logic units from the left side circuitry 372 and the right side circuitry 374 are aligned and in which the primary driver and the secondary drivers in the right side circuitry are aligned to provide the balanced design may also be used with the logic units described herein.

Each shift register may also generate CARRY signals that may be used as SET and/or RESET (e.g., RST) inputs to other shift registers on the same side of the alternate-logic H2H GOA system 370. In the illustrated portion of FIG. 14, a CARRY signal 392 from shift register 382A may be used as a SET input for the shift register 382C and the CARRY signal 394 may be used as a SET input for the shift register 382E and RESET input for the shift register 382A. Note that in the illustrated system, the SET input of a shift register may be coupled to a CARRY output of a shift register that is arranged two shift registers above. That is, SET [N]=CARRY [N−4], in which N is an index for shift registers from both left side circuitry 372 and right side circuitry 374 (e.g., 382A is N=1, 382F is N=2, 382B is N=3, etc.). Similarly, the RESET input of a shift register may be coupled to a CARRY output of a shift register that is two shift registers below. That is RST [N]=CARRY [N+6]. The alternate-logic H2H GOA system 370 may employ a different type of structure. As an example, an alternate-logic H2H GOA system 370 in which SET [N]=CARRY [N−4] and RST [N]=CARRY [N+4] may be obtained by connecting the wires of adjacent shift registers. This type of logical connection may facilitate the alternate-logic arrangement in the alternate-logic H2H GOA system 370, which allows reduction in the number of shift registers relative to conventional GOA systems.

Figure 15:
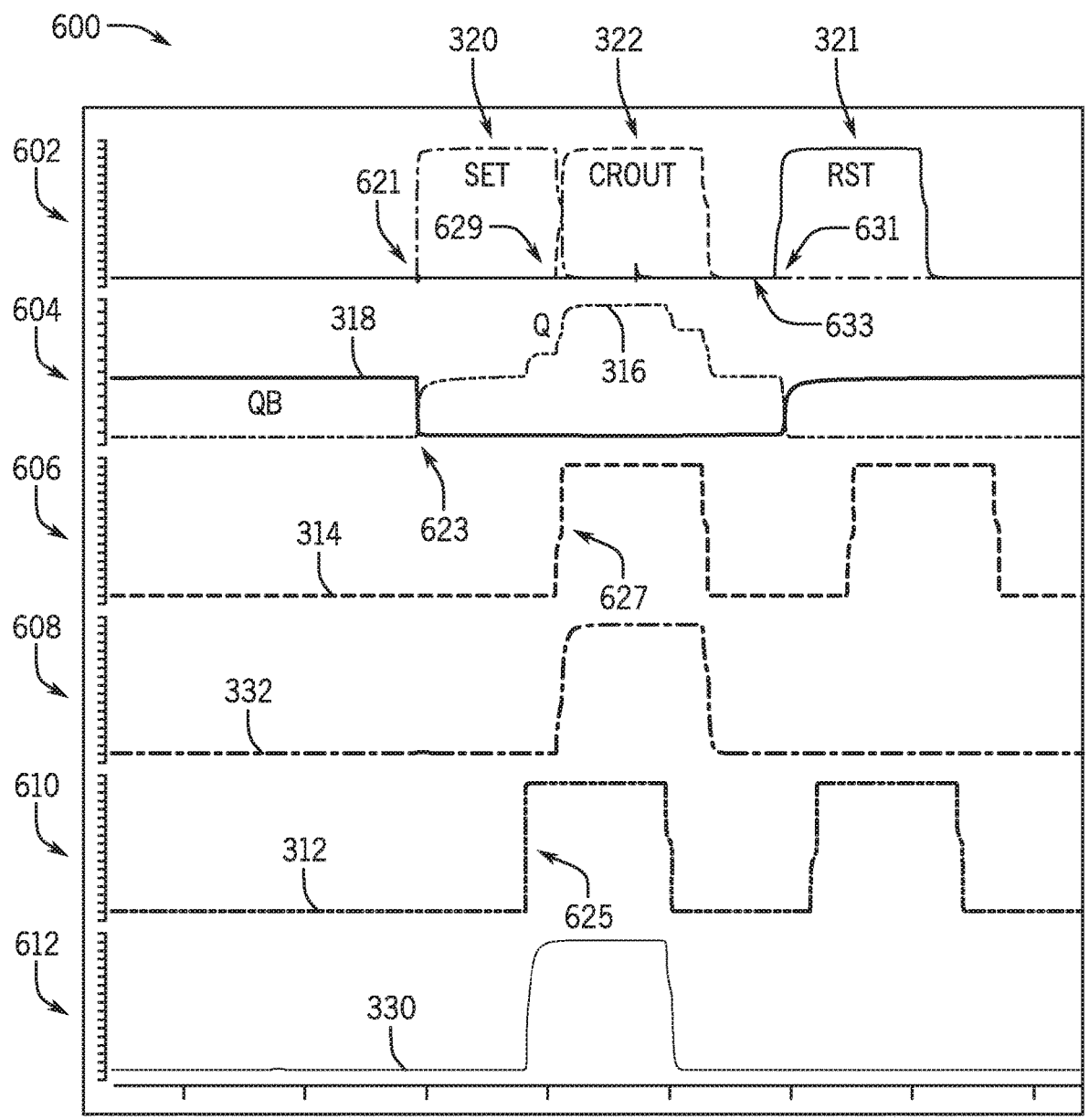
FIG. 15 is a chart illustrating simulated signals for the GOA logic unit of FIG. 12, in accordance with an embodiment.

FIG. 15 is a chart 600 that provides simulated results for a logic unit, such as the GOA logic unit 301 of FIG. 12 when arranged in an alternate-logic H2H GOA system, such the alternate-logic H2H GOA system 370 that of FIG. 14. As such, the operation described herein may be understood in view of GOA logic unit 301 of FIGS. 12 and 13. References to signals in the chart 600 may refer to signals with similar numbering as illustrated in FIG. 12. The chart 600 has subplot 602, which indicates the logic signals in the shift register 302. Specifically, subplot 602 illustrates the input set signal 320, the input reset signal 321, and the output carry signal 322. The subplot 604 that indicates the output Q signal 316 and QB signal 318 of the shift register 302. Subplots 606 and 608 illustrate, respectively, the primary clock signal 314 and the output 332 of the primary driver 304B. Subplot 610 and 612 illustrate, respectively, the secondary clock signal 312 and the output 330 of the secondary driver 304A.

As discussed above, the logic inputs set signal 320 and reset signal 321 may control the shift register 302. At time 621, the input set signal 320 may be asserted by a carry output signal of a neighboring shift register. As a result, the QB signal 318 becomes low and the Q signal 316 becomes high at time 623. The secondary driver 304A may receive the Q signal 316 and the QB signal 318 and the output 330 may be pulled to the secondary clock signal 312. As a result, at time 625, when the secondary clock signal 312 is asserted, the output 330 of the secondary driver 304A is pulled up to a high level. Similarly, the primary driver 304B may receive the Q signal 316 and the QB signal 318 and the output 332 may be pulled to the primary clock signal 314. As a result, at time 627, when the primary clock signal 314 is asserted, the output 332 of the primary driver 304B is pulled up to a high level. When the set signal 320 is de-asserted, an output carry signal 322 may be asserted in the output of the shift register 302 at time 629. At time 631, when the input reset signal 321 is asserted, the Q signal 316 and the QB signal 318 may be inverted. The primary driver 304B and the secondary driver 304A may have their respective outputs 332 and 330 pulled down to a low-voltage level from a power supply. Note that the chart 600 relates to the system of FIG. 14, in which the shift registers are coupled using a SET [N]=CARRY [N−4] and RST [N]=CARRY [N+6] arrangement. In such system, a time interval 633 may appear.

Figure 16:
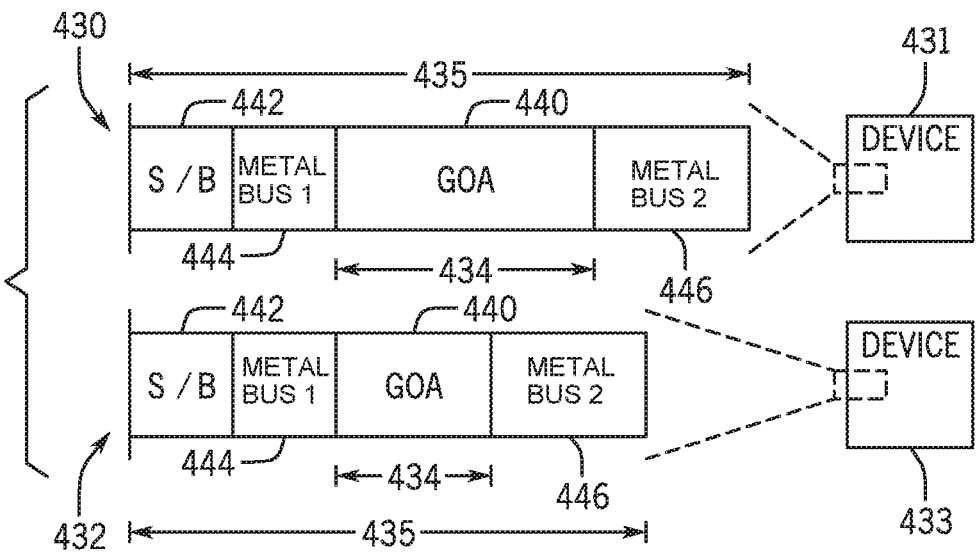
FIG. 16 is a comparative illustration of bezels of electronic devices that may employ a H2H GOA system or an alternate-logic H2H GOA system, in accordance with an embodiment.

FIG. 16 is a diagram illustrating a potential reduction in bezel width that may be obtained by using the display circuitry in the border of an electronic device. In particular, FIG. 16 shows a border section 430 of a device 431, that may employ a conventional H2H GOA system without alternate logic (i.e., each driver is coupled to a dedicated shift register), and a border section 432 of a device 433, that may employ an alternate-logic H2H GOA system (i.e., a primary and a secondary driver may be share a shift register), such as the alternate-logic H2H GOA system 370 illustrated in FIG. 14. Devices 431 and 433 may have a display with resolution of 2732×2048 pixels. The table below illustrates estimated dimensions for embodiments of electronic devices 431 and 433 that have respective border sections 430 and 432. Border sections 430 and 432 may, each, include a scribe and break (S/B) section 442, a first metal bus section 444, GOA circuitry 440, and a second metal bus section 446. As discussed above, the use of the alternate-logic design allows substantial reduction of the GOA circuitry 440 by obviating the use of two dedicated shift registers per row. In the alternate-logic design, the GOA system may have an average distribution of a single shift register per row. Note the reduction of 365 μm in the dimensions of the GOA section 400, leading to an approximately 35% reduction in the GOA section length 434 and approximately 20% reduction in the bezel circuitry length 435 for the border section 432.

| Display | Conventional H2H GOA (μm) | Alternate logic H2H GOA (μm) |
| --- | --- | --- |
| Metal Bus 2 446 | 312 | 312 |
| GOA 440 | 1064 | 699 |
| Metal Bus 1 444 | 140 | 140 |
| S/B 442 | 250 | 250 |
| Total | 1696 | 1331 |

As discussed above, the use of shift registers that may control one or more pixel row drivers may allow reduction of the circuitry in the border of a display, which may facilitate reduction of the bezel. In some embodiments, the reduction of the GOA may be associated with the number of pixel rows or pixel columns. The use of the alternate logic may allow a reduction in the bezel width of 5%, 10%, 15%, 20%, 25%, 30%, 40%, or 50% based, among other things, on the dimensions of other circuitry (e.g., the sizes of the shift register and the drivers, the dimensions of the transistors in the drivers, and the dimensions of other circuitry in the bezel). In some embodiments, the use of the alternative-logic GOA circuitry may reduce the dimension of the GOA circuitry in a particular dimension with respect to the metal bus circuitry and/or other circuitry. For example, the contribution of the dimension of the GOA circuitry (e.g., GOA section length 434) relative to the total length 435 may be reduced from about 60% to about 50%, or less. In embodiments where each shift register controls four drivers, for example, the bezel thickness reduction may be of up to 75%. It should be understood that the presence of other circuitry may also impact the bezel width.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device comprising:
a display comprising:
a pixel array comprising a plurality of pixel groups; and
gate on array circuitry comprising:
a first driver configured to receive a first clock signal and a first gate-enable signal, and provide a first driving output to a first pixel group of the plurality of pixel groups;
a second driver configured to receive a second clock signal and the first gate-enable signal, and provide a second driving output to a second pixel group of the plurality of pixel groups;
a bootstrapping capacitor coupled to the first driver and the second driver, wherein the bootstrapping capacitor is configured to facilitate operations of the first driver and the second driver; and
a first shift register configured to generate the first gate-enable signal.

2. The electronic device of claim 1, wherein each pixel group of the plurality of pixel groups comprise a row of pixels.

3. The electronic device of claim 1, wherein the first driver comprises a first gate driver output circuitry and the second driver comprises a second gate driver output circuitry.

4. The electronic device of claim 3, wherein each gate driver output circuitry comprises an n-type metal oxide semiconductor (NMOS) output circuitry.

5. The electronic device of claim 1, wherein the first driver comprises the bootstrapping capacitor, and wherein the bootstrapping capacitor is disposed between an output of the first driver and a transistor gate of a transistor of the first driver.

6. The electronic device of claim 1, wherein the first shift register comprises a SET input and a RESET input, and wherein the first gate-enable signal comprises a high signal in response to the SET input receiving a high signal and the RESET input receiving a low signal.

7. The electronic device of claim 1, wherein the first gate-enable signal is configured to drive the first driving output to the first clock signal and drive the second driving output to the second clock signal.

8. A display comprising:
a display portion comprising at least a first pixel row, a second pixel row, and a third pixel row; and
a bezel disposed along a periphery of the display portion, wherein the bezel comprises a first bezel portion and a second bezel portion located on an opposite side of the bezel relative to the first bezel portion;
first gate on array (GOA) circuitry disposed in the first bezel portion, wherein the first GOA circuitry comprises a first plurality of logic units, wherein at least a first logic unit of the first plurality of logic units is configured to drive the first pixel row; and
second GOA circuitry disposed in the second bezel portion, wherein the second GOA circuitry comprises a second plurality of logic units, wherein at least a second logic unit of the second plurality of logic units is configured to drive the third pixel row, and wherein at least the first logic unit of the first GOA and at least the second logic unit of the second GOA are configured to drive the second pixel row.

9. The display of claim 8, wherein the first pixel row comprises a dummy pixel row.

10. The display of claim 8, wherein the at least the first logic unit of the first plurality of logic units comprises:
a shift register;
a primary driver configured to receive a first gate-enable signal from the shift register and generate a first driver output to the second pixel row; and
a secondary driver configured to receive the first gate-enable signal from the shift register and generate a second driver output to the first pixel row.

11. The display of claim 10, wherein the primary driver comprises a respective bootstrapping capacitor disposed between an output of the primary driver and a gate of a transistor of the primary driver, wherein the at least the second logic unit of the second plurality of logic units comprises a second secondary driver, wherein the second secondary driver is configured to generate a third driver output to the second pixel row, and the second secondary driver does not comprise a bootstrapping capacitor.

12. The display of claim 10, wherein the at least the first logic unit of the first plurality of logic units comprises a SET input signal and a RESET input signal, and wherein the first gate-enable signal comprises a high signal in response to the SET input signal receiving a high signal and the RESET input signal receiving a low signal.

13. The display of claim 12, wherein the first plurality of logic units comprises a second logic unit configured to provide a carry output signal that is coupled to the SET input signal or the RESET input signal of the at least the first logic unit.

14. A display comprising:
a pixel array comprising a plurality of pixel rows; and
a bezel disposed along a periphery of the pixel array, wherein the bezel comprises a first bezel portion that comprises a first bezel length; and
first gate on array circuitry disposed in the first bezel portion, wherein the first gate on array circuitry comprises a plurality of logic units, wherein each logic unit of the plurality of logic units comprises a shift register coupled to a primary driver and a secondary driver;
wherein the first bezel length comprises a gate on array length and the gate on array length comprises a percentage of the first bezel length that is smaller than a threshold percentage, and wherein at least one pixel row is coupled to a respective primary driver of the first gate on array circuitry and a respective secondary driver of a second gate on array circuitry.

15. The display of claim 14, comprising:
a second bezel portion of the bezel disposed on an opposite side of the pixel array from the first bezel portion, wherein the second bezel portion comprises the first bezel length; and
the second gate on array circuitry disposed in the second bezel portion, wherein the second gate on array circuitry comprises a second plurality of logic units, wherein each logic unit of the second plurality of logic units comprises a second shift register coupled to a second primary driver and a second secondary driver.

16. The display of claim 14, wherein each primary driver comprises a gate driver output circuitry, wherein the gate driver output circuitry comprises a first bootstrapping capacitor coupled to an output of the primary driver and a transistor gate of a pull-up transistor of the gate driver output circuitry.

17. The display of claim 14, wherein the first bezel length comprises a first metal bus length or a second metal bus length, or both.

18. The display of claim 14, wherein at least one logic unit of the plurality of logic units comprises a SET input and a RESET input.

19. The display of claim 18, wherein the plurality of logic units comprises a second logic unit configured to provide a carry output signal that is coupled to the SET input or the RESET input of the at least one logic unit.

20. The display of claim 14, wherein the threshold percentage comprises 60%.

21. The electronic device of claim 1, wherein the first shift register is configured to output a first output signal comprising a gate enable signal, and output a second output signal comprising a complementary gate enable signal, to control the first and the second drivers.

* * * * *